US009542333B2

(12) United States Patent
Molloy et al.

(10) Patent No.: US 9,542,333 B2
(45) Date of Patent: Jan. 10, 2017

(54) SYSTEMS AND METHODS FOR PROVIDING IMPROVED LATENCY IN A NON-UNIFORM MEMORY ARCHITECTURE

(71) Applicant: QUALCOMM INCORPORATED, San Diego, CA (US)

(72) Inventors: Stephen Arthur Molloy, Carlsbad, CA (US); Dexter Tamio Chun, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 158 days.

(21) Appl. No.: 14/560,450

(22) Filed: Dec. 4, 2014

(65) Prior Publication Data

US 2016/0162415 A1 Jun. 9, 2016

(51) Int. Cl.
*G06F 12/02* (2006.01)
*G06F 12/10* (2016.01)
*G11C 7/10* (2006.01)

(52) U.S. Cl.
CPC ....... *G06F 12/1009* (2013.01); *G06F 12/1072* (2013.01); *G11C 7/1072* (2013.01); *G06F 2212/2542* (2013.01); *G06F 2212/657* (2013.01)

(58) Field of Classification Search
None
See application file for complete search history.

(56) References Cited

U.S. PATENT DOCUMENTS

| | | |
|---|---|---|
| 5,897,664 A | 4/1999 | Nesheim et al. |
| 6,049,853 A | 4/2000 | Kingsbury et al. |
| 6,167,437 A | 12/2000 | Stevens et al. |
| 6,618,799 B2 | 9/2003 | Hagersten |
| 6,871,219 B2 | 3/2005 | Noordergraff et al. |
| 7,360,056 B2 | 4/2008 | Cypher et al. |
| 7,765,381 B2 | 7/2010 | Landin et al. |

(Continued)

OTHER PUBLICATIONS

Kshitij Sudan et al., Micro-Pages: Increasing DRAM Efficiency with Locality-Aware Data Placement, ASPLOS'10, Mar. 13-17, 2010 Pittsburgh, Pennsylvania, USA.

(Continued)

*Primary Examiner* — Duc Doan
(74) *Attorney, Agent, or Firm* — Smith Tempel

(57) ABSTRACT

Systems, methods, and computer programs are disclosed for allocating memory in a portable computing device having a non-uniform memory architecture. One embodiment of a method comprises: receiving from a process executing on a first system on chip (SoC) a request for a virtual memory page, the first SoC electrically coupled to a second SoC via an interchip interface, the first SoC electrically coupled to a first local volatile memory device via a first high-performance bus and the second SoC electrically coupled to a second local volatile memory device via a second high-performance bus; determining whether a number of available physical pages on the first and second local volatile memory devices exceeds a minimum threshold for initiating replication of memory data between the first and second local volatile memory devices; and if the minimum threshold is exceeded, allocating a first physical address on the first local volatile memory device and a second physical address on the second local volatile memory device to a single virtual page address.

36 Claims, 14 Drawing Sheets

(56) References Cited

U.S. PATENT DOCUMENTS

| | | |
|---|---|---|
| 8,560,757 B2 | 10/2013 | Pangborn et al. |
| 2002/0065998 A1 | 5/2002 | Buckland |
| 2005/0108496 A1* | 5/2005 | Elnozahy ............ G06F 12/1045 711/203 |
| 2009/0153897 A1 | 6/2009 | Blackmore et al. |
| 2010/0321397 A1 | 12/2010 | Ginzburg |
| 2011/0029797 A1* | 2/2011 | Vaden ................... G06F 1/3225 713/324 |
| 2015/0178199 A1* | 6/2015 | Wang ................... G06F 12/084 711/122 |
| 2016/0070598 A1* | 3/2016 | Vadkerti ............. G06F 9/45558 718/104 |
| 2016/0162399 A1 | 6/2016 | Molloy et al. |

OTHER PUBLICATIONS

Dashti M., et al., "Traffic management: a holistic approach to memory placement on NUMA systems," ASPLOS '13 Proceedings of the eighteenth international conference on Architectural support for programming languages and operating systems, 2013, pp. 381-394.

Lee D., et al., "Tiered-latency DRAM: A low latency and low cost DRAM architecture," HPCA '13 Proceedings of the 2013 IEEE 19th International Symposium on High Performance Computer Architecture (HPCA), 2013, pp. 615-626.

\* cited by examiner

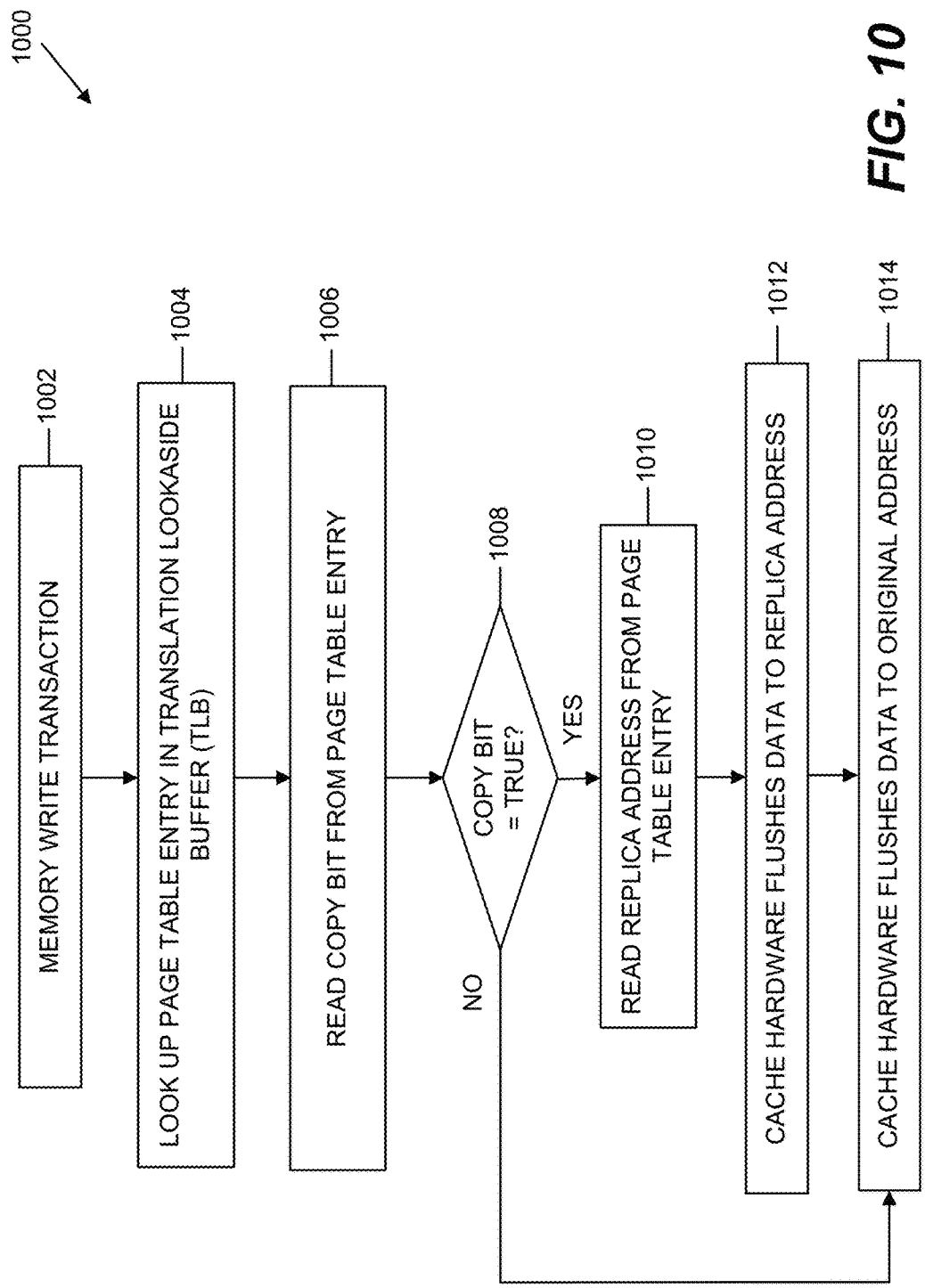

SYSTEMS AND METHODS FOR PROVIDING IMPROVED LATENCY IN A NON-UNIFORM MEMORY ARCHITECTURE

DESCRIPTION OF THE RELATED ART

Portable computing devices (e.g., cellular telephones, smart phones, tablet computers, portable digital assistants (PDAs), and portable game consoles) continue to offer an ever-expanding array of features and services, and provide users with unprecedented levels of access to information, resources, and communications. To keep pace with these service enhancements, such devices have become more powerful and more complex. Portable computing devices now commonly include a system on chip (SoC) comprising one or more chip components embedded on a single substrate (e.g., one or more central processing units (CPUs), a graphics processing unit (GPU), digital signal processors, etc.).

As it becomes more challenging to increase the transistor density on integrated circuits, the cost of two-dimensional monolithic integration may become prohibitive, resulting in increased use of multi-die or multi-SoC products in portable computing devices. Such multi-die products may comprise interconnected physical dies, each providing access to fast local memory, such as, dynamic random access memory (DRAM). Such architectures are generally referred to as non-unified memory architectures (NUMA). NUMA designs, however, present situations where the data in a near or local DRAM accessible via a high-performance bus or a far DRAM accessible via a lower-performance inter-chip interface need to be accessed by processors on either die. This can result in higher latency when, for example, a processor has to go to the far DRAM.

Accordingly, there is a need to provide systems and methods of low-latency memory access for all processors in a non-unified memory architecture.

SUMMARY OF THE DISCLOSURE

Systems, methods, and computer programs are disclosed for allocating memory in a portable computing device having a non-uniform memory architecture. One such method involves receiving, from a process executing on a first system on chip (SoC), a request for a virtual memory page. The first SoC is electrically coupled to a second SoC via an interchip interface. The first SoC is electrically coupled to a first local volatile memory device via a first high-performance bus, and the second SoC is electrically coupled to a second local volatile memory device via a second high-performance bus. The method further involves determining whether a number of available physical pages on the first and second local volatile memory devices exceeds a minimum threshold for initiating replication of memory data between the first and second local volatile memory devices. If the minimum threshold is exceeded, a first physical address on the first local volatile memory device and a second physical address on the second local volatile memory device are allocated to a single virtual page address.

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

FIG. 10 is a flowchart illustrating an exemplary write transaction implementing the page table entry of FIG. 8.

DETAILED DESCRIPTION

Figure 1:
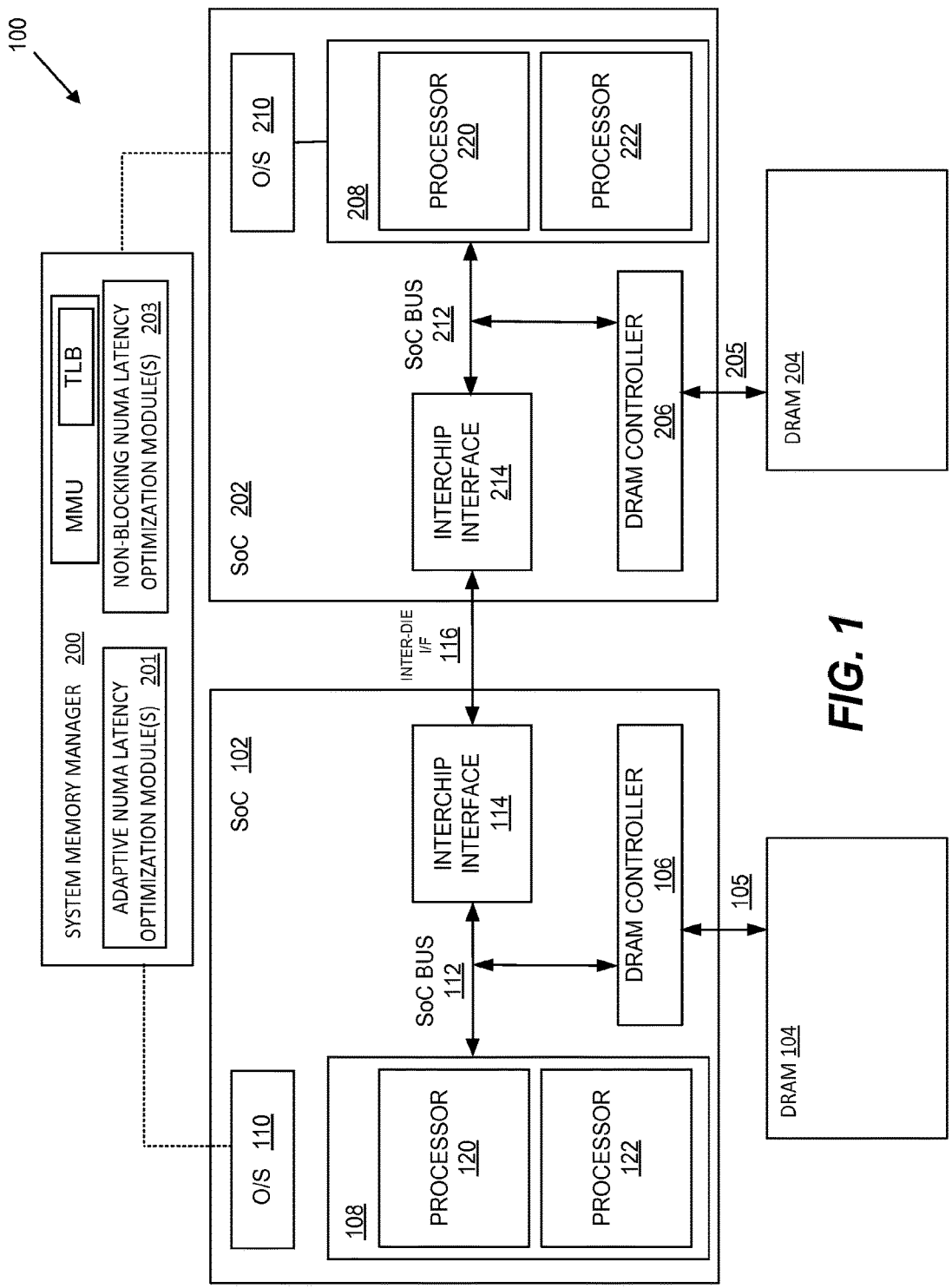
FIG. 1 is a block diagram of an embodiment of a system comprising a plurality of interconnected system on chips (SoCs) having a non-uniform memory architecture (NUMA).

The word "exemplary" is used herein to mean "serving as an example, instance, or illustration." Any aspect described herein as "exemplary" is not necessarily to be construed as preferred or advantageous over other aspects.

In this description, the term "application" or "image" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

The term "virtual memory" refers to the abstraction of the actual physical memory from the application or image that is referencing the memory. A translation or mapping may be used to convert a virtual memory address to a physical memory address. The mapping may be as simple as 1-to-1 (e.g., physical address equals virtual address), moderately complex (e.g., a physical address equals a constant offset from the virtual address), or the mapping may be complex (e.g., every 4 KB page mapped uniquely). The mapping may be static (e.g., performed once at startup), or the mapping may be dynamic (e.g., continuously evolving as memory is allocated and freed). In this description, the terms "communication device," "wireless device," "wireless telephone", "wireless communication device," and "wireless handset" are used interchangeably. With the advent of third generation ("3G") wireless technology and four generation ("4G"), greater bandwidth availability has enabled more portable computing devices with a greater variety of wireless capabilities. Therefore, a portable computing device may include a cellular telephone, a pager, a PDA, a smartphone, a navigation device, or a hand-held computer with a wireless connection or link.

FIG. 1 illustrates an embodiment of a system 100 comprising a plurality of interconnected physical dies (e.g., system on chip (SoC) 102 and SoC 202) having a non-uniform memory architecture (NUMA). The system 100 may be implemented as a multi-die product designed for, or otherwise residing in, any computing device, including a personal computer, a workstation, a server, a portable computing device (PCD), such as a cellular telephone, a portable digital assistant (PDA), a portable game console, a palmtop computer, or a tablet computer. SoC 102 and 202 are electrically coupled via an inter-die interface 116. Each SoC is electrically coupled to a near or local volatile memory device (e.g., a dynamic random access memory (DRAM) device) via a high-performance bus. As illustrated in the embodiment of FIG. 1, SoC 102 is connected to a local DRAM 104 via a bus 105, and SoC 202 is connected to a local DRAM 204 via a bus 205. Buses 105 and 205 provide faster, higher-performance access with lower latency to local DRAM 104 and 204 by SoC 102 and 202, respectively. As known in the art, NUMA enables each SoC 102 and 202 to access the local DRAM of the other SoC, the inter-die interface 116 may result in higher latency and relatively lower performance.

SoC 102 and 202 comprises various on-chip or on-die components. It should be appreciated that the on-chip components may vary, as needed, and the system 100 may comprise any number of SoCs. In the embodiment of FIG. 1, SoC 102 comprises one or more processors 108 (e.g., a central processing unit (CPU), a graphics processing unit (GPU), a digital signal processor (DSP), etc.), a DRAM controller 106, and an interchip interface controller 114 interconnected via a SoC bus 112. SoC 202 comprises one or more processors 208, a DRAM controller 206, and an interchip interface controller 214 interconnected via a SoC bus 212. SoC 102 and 202 may include one or more memory clients that request memory resources from either the SoC local DRAM (via buses 105 and 205, respectively) or from the far DRAM connected to the other SoC via the inter-die interface 116. DRAM controllers 106 and 206 manage the flow of data going to and from the DRAM 104 and 204, respectively. Interchip interface controllers 114 and 214 manage the flow of data between SoC 102 and 202.

Each SoC may comprise an operating system (O/S 110 and 210), which supports virtual memory management via, for example, a system memory manager 200. The system memory manager 200 is configured to control various memory management techniques that may be implemented using both hardware and/or software. As known in the art, the system memory manager 200 maps memory addresses used by a program, called virtual addresses, into physical addresses in computer memory. O/S 110 and 210 manage virtual address spaces and the assignment of physical memory (e.g., DRAM 104 and 204) to virtual memory. Address translation hardware, such as memory management units (MMUs), translates virtual addresses to physical addresses.

Figure 2:
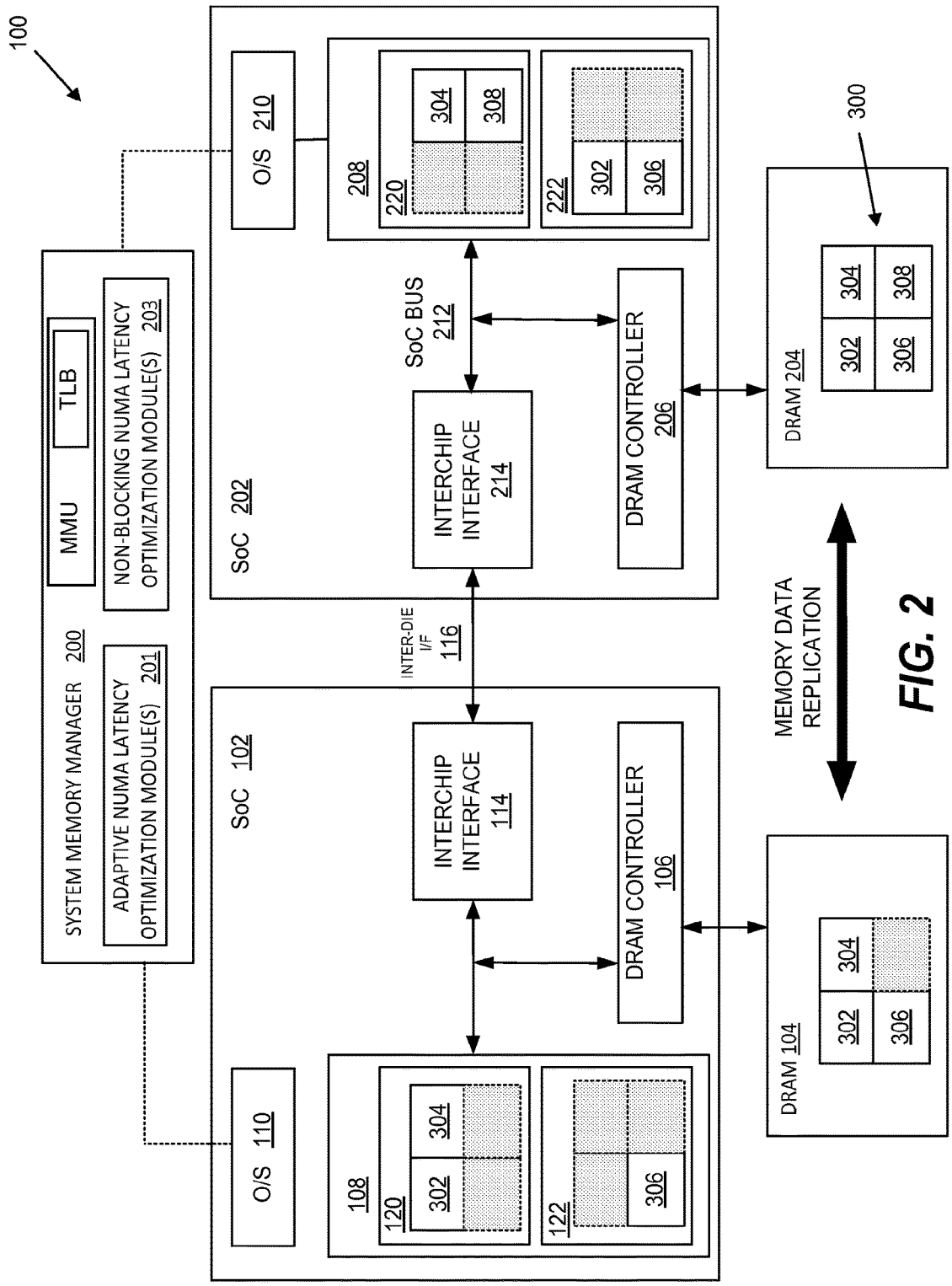
FIG. 2 illustrates the system of FIG. 1 with memory data selectively replicated across the SoCs.

Referring to FIG. 2, it should be appreciated that O/S 110, O/S 210, and system memory manager 200 may be configured to support a NUMA in which memory access, tasks, and workloads are managed across multiple processors. As described below in more detail, system memory manager 200 may comprise various module(s) for providing memory access with improved latency across multiple processors in the non-uniform memory architecture of system 100. Adaptive NUMA latency optimization module(s) 201 are described below in connection with FIGS. 3-7, and non-blocking NUMA latency optimization module(s) are described below in connection with FIGS. 8-12.

As illustrated in the exemplary embodiment of FIG. 2, the system memory manager 200 may be configured to selectively replicate memory data such that each die (e.g., SoCs 102 and 202) has a copy of the data in local DRAM (i.e., the DRAM directly connected to it). For example, memory data 300 residing in DRAM 204 may be accessed by a plurality of processors. Memory data 300 may comprise a plurality of data portions 302, 304, 306, and 308. Residing on SoC 202, processor 220 may request access to data 304 and 308, and processor 222 may request access to data 302 and 306. Residing on SoC 102, processor 120 may request access to data 302 and 304, and processor 122 may request access to data 306. While the NUMA enables processors 120 and 122 to access the memory data 300 via inter-die interface 116, it may be desirable to selectively replicate memory data located in DRAM 204 on DRAM 104 (or vice versa) to provide processors 120 and 122 on SoC 102 with higher-performance, lower latency access to the memory they need.

Figure 3:
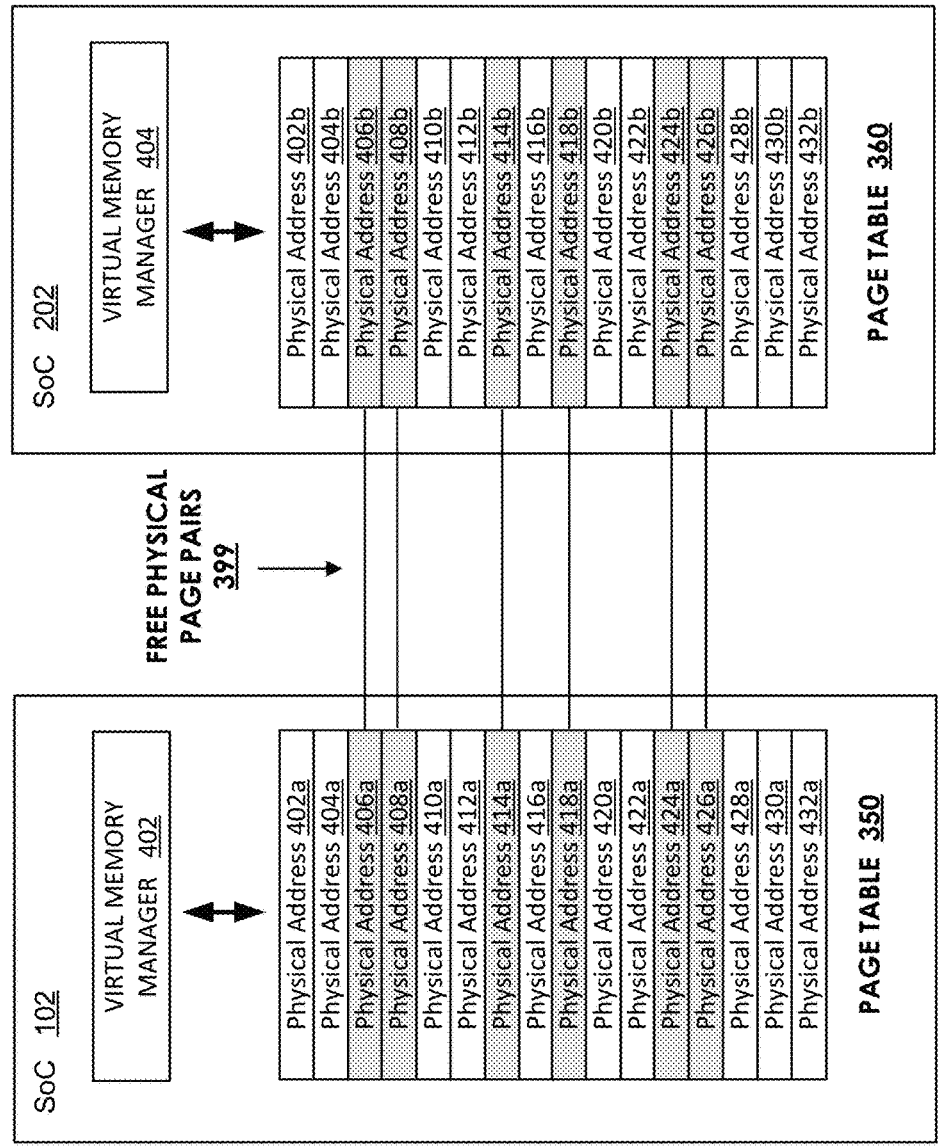
FIG. 3 is a block diagram illustrating an embodiment of page tables in the SoCs comprising free physical page pairs having a same physical address.
Figure 4:
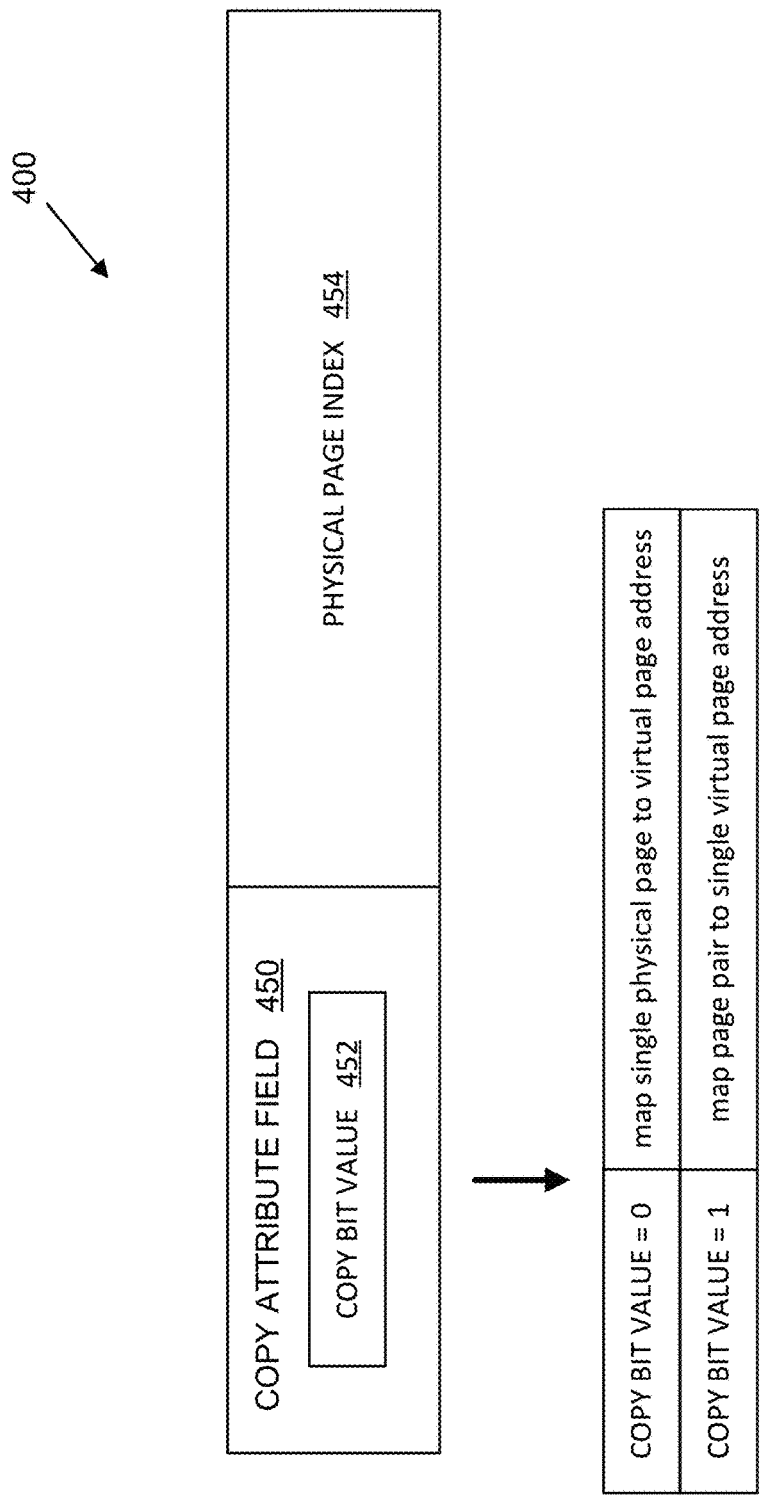
FIG. 4 is a block diagram illustrating an embodiment of a data structure for implementing a page table entry comprising a copy attribute field for mapping a free physical page pair to a single virtual address.

It should be appreciated that various methods, algorithms, and techniques may be employed for selectively replicating memory data in system 100. In the embodiment illustrated in FIGS. 3-7, the system 100 replicates memory data by locating, identifying, and/or managing free physical page pairs. As illustrated in FIG. 3, a free physical page pair 399 comprises a logical mapping of an available physical address in DRAM 104 with the same available physical address in DRAM 204. It should be appreciated that, in an exemplary embodiment, the same physical address may refer to two physical page addresses having identical lower N bits of their page address, where N=log2(capacity of a single memory chip). For example, in a 2 GB system comprising two 1 GB memory chips, a physical page pair may have identical address bits at position (29, 28, 27 . . . 14, 13, 12). It should be appreciated that bits (11, 10 . . . 1, 0) may not be compared because they may already be within, for example, a 4 KB page. The logical mapping may be provided via page tables 350 and 360. Page table 350 (corresponding to DRAM 104) may be managed by a virtual memory manager 402 executing on SoC 102. Page table 360 (corresponding to DRAM 204) may be managed by a virtual memory manager 404 executing on SoC 202. Page tables 350 and 360 comprise an index to a range of physical addresses 402-432. As an example, physical address 402a in page table 350 and physical address 402b in page table 360 represent a physical page pair because they have the same physical address. A free or available physical page pair 399 refers to a physical page pair (i.e., 402a/b, 404a/b, 406a/b, etc.) that is available for memory allocation in both DRAM 104 and 204. In FIG. 3, free physical page pairs are identified in the grey-out boxes. In this regard, physical addresses referenced with the letter "a" (e.g., 406a, 408a, etc.) correspond to SoC 102/DRAM 104 and physical addresses referenced with the letter "b" (e.g., 406b, 408b, etc.) correspond to SoC 202/DRAM 204 with the same numbered "a/b" pairs comprising the physical page pairs 399. To selectively replicate memory data for access across multiple processors (e.g., processors 120 and 122 on SoC 102 and processors 220 and 222 on SoC 202), a modified page table entry 400 may be provided, as illustrated in FIG. 4. The modified page table entry 400 comprises a field 454 for storing a physical page index 454 to a physical address, as well as a copy attribute field 450 for storing a copy bit value 452. A copy bit value of "0" or "false" may be used in a default operation to map a single physical page to a corresponding virtual page address. When improved latency is desired and as free physical page pairs 399 are available, the copy bit value may be set to "1" or "true", which enables the system 100 to logically map the free physical page pair 399 to a same virtual page address. It should be appreciated that the copy attribute field 450 may be used to selectively replicate memory data such that each SoC die has a copy of the data in local DRAM.

Figure 5:
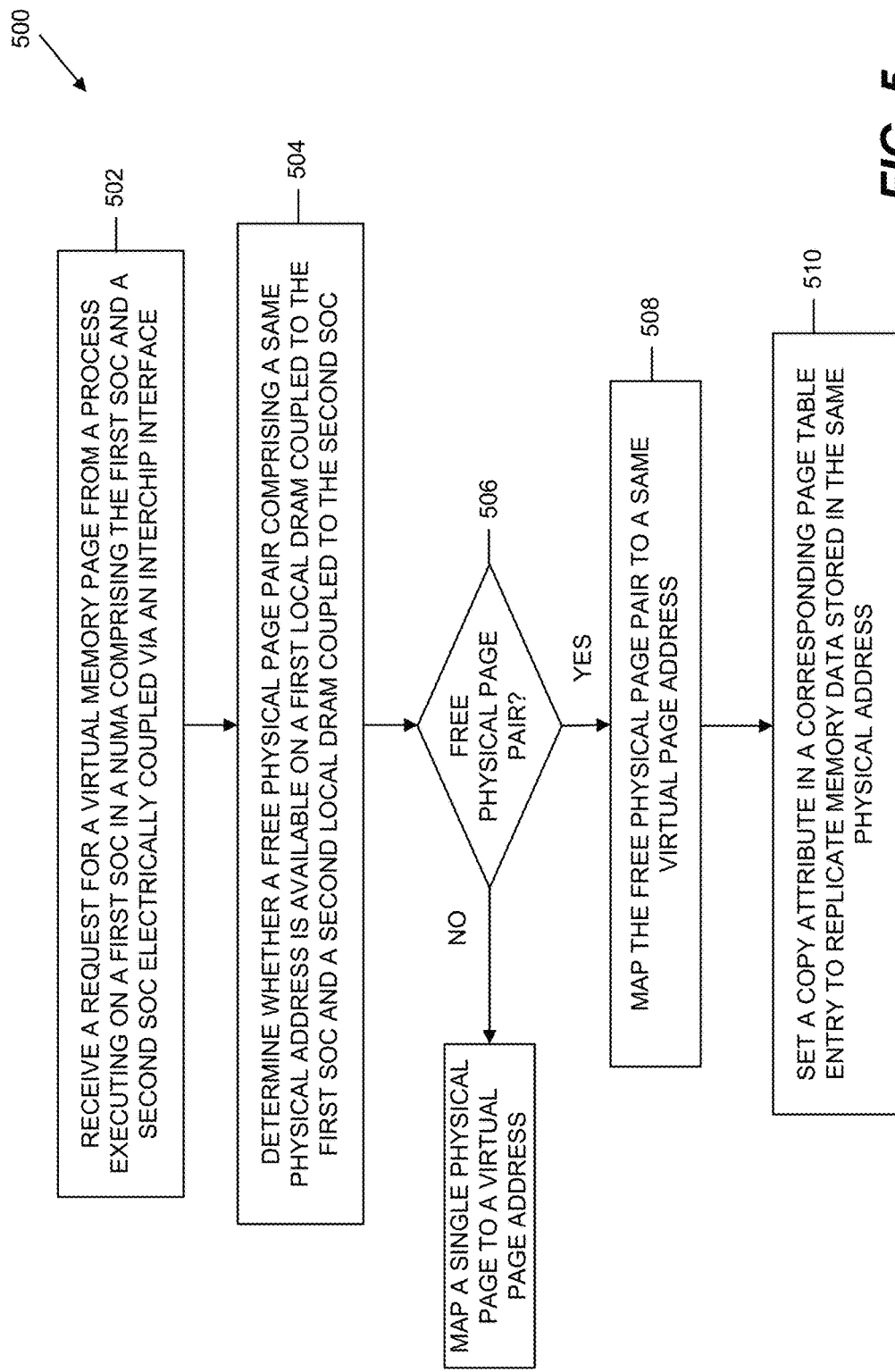
FIG. 5 is a flowchart illustrating an embodiment of a method implemented by the adaptive NUMA latency optimization module(s) in FIGS. 1 and 2.

FIG. 5 illustrates a method 500 for allocating memory in a NUMA using free physical page pairs 399. The method 500 may be implemented by the O/S 110, O/S/ 210, and/or the system memory manager 200. At block 500, a request may be received from a process executing on a first SoC 102 for a virtual memory page. At block 502, the first SoC, as enabled by the system memory manager, determines whether there are any free physical page pairs 399. If a free physical page pair 399 is not available (decision block 506), a virtual page address may be logically mapped to a single physical page. However, if available, the free physical page pair 399 may be logically mapped to a same virtual page address (block 508). As described above, the logical mapping may be performed by modifying the page table entry 350. For example, at block 510, the copy attribute field 450 may be modified by setting the copy bit value 452 to a value of "1" or "true", which replicates memory data stored in the same physical address on DRAM 104 and 204.

Figure 6:
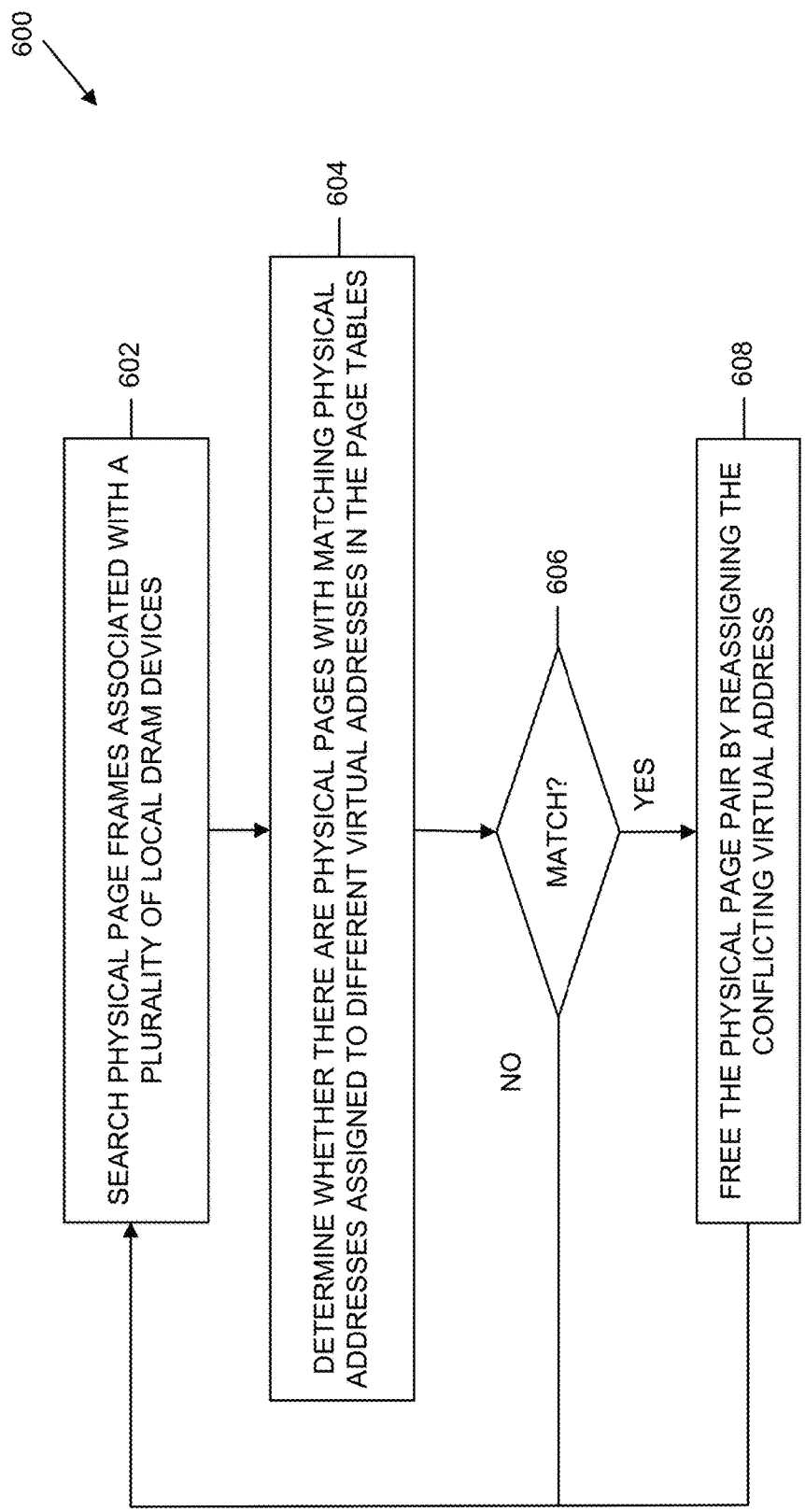
FIG. 6 is a flowchart illustrating an embodiment of a method implemented by an operating system for freeing up physical page pairs.

The system memory manager 200 is configured to enable the O/S 110 and O/S 210 to perform a background process to locate and/or manage free physical page pairs 399. FIG. 6 illustrates a method 600 for freeing up additional free physical page pairs 399. A global directory of all memory physical pages is provided. At block 602, the operating system searches through the global directory. At block 604, the operating system determines whether the page tables 350 and 360 identify any physical pages with matching physical addresses assigned to different virtual addresses. If no matches exist (decision block 606), flow returns to block 602 for subsequent checks for potential matches. If a match is found, the requesting operating system creates a free physical page pair 399 by reassigning the conflicting virtual address of one of the physical pages at block 608. After removing the associated conflicting virtual address, the remaining physical page with the original physical address is now available as a new free physical page pair 399.

Figure 7:
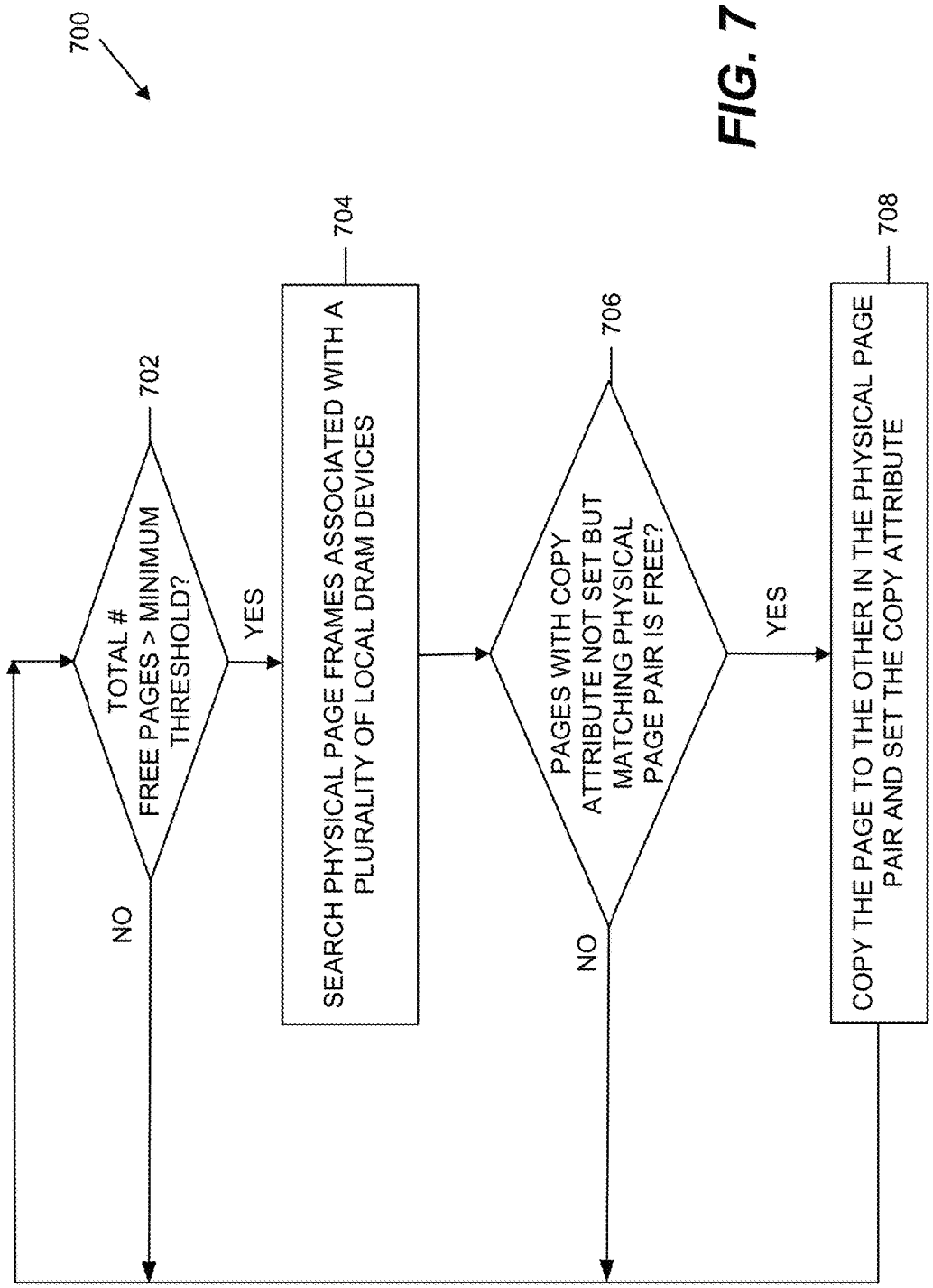
FIG. 7 is a flowchart illustrating an embodiment of a method for converting previously allocated single pages to free physical page pairs.

FIG. 7 illustrates another technique for improving performance of memory replication by converting previously allocated single pages to paired pages. The method 700 may be used to determine situations in which there is less memory pressure and it becomes desirable to switch from a default non-replicating mode to the replication mode described above. At decision block 702, the operating system may determine whether a total number of free pages exceeds a minimum threshold. If the threshold is not exceeded, decision block 702 may be repeated at a predetermined interval. If the threshold is exceeded, at block 704, the operating system may search through all memory physical page frames in the global directory. The operating system may determine whether there exist pages with the copy bit value 452 not enabled (value="0" or "false") but the matching page pair is free. At decision block 706, if a match is located, the operating system may copy the page to the other in the page pair and set the copy bit value to "1" or "true").

Figure 8:
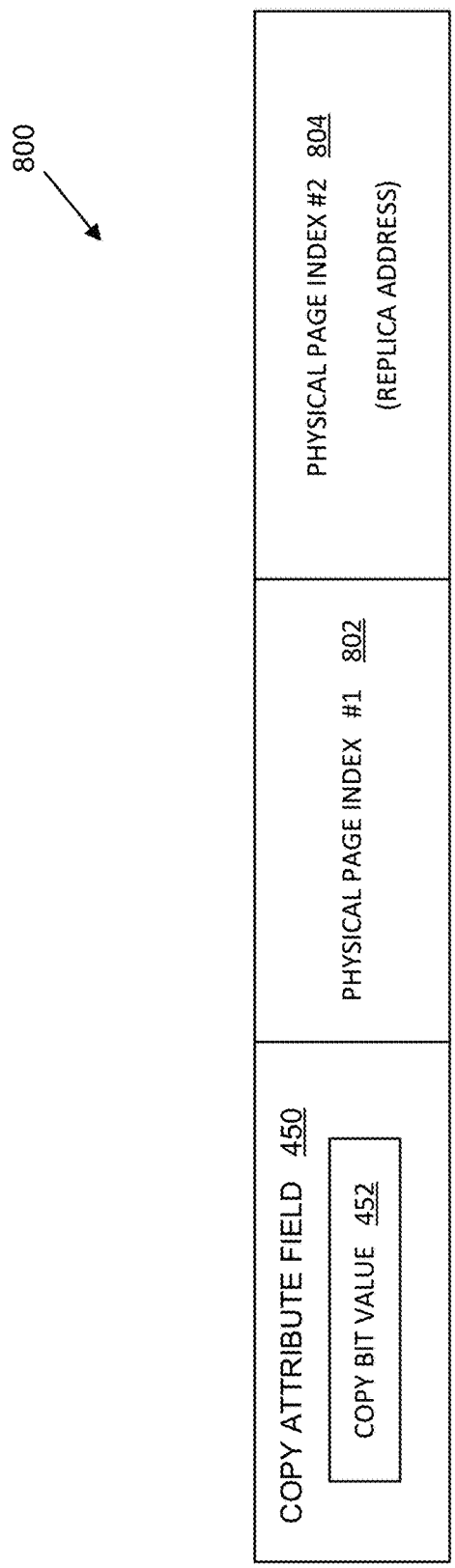
FIG. 8 is a block diagram illustrating another embodiment of a data structure for implementing a page table entry in the system of FIGS. 1 and 2.
Figure 11:
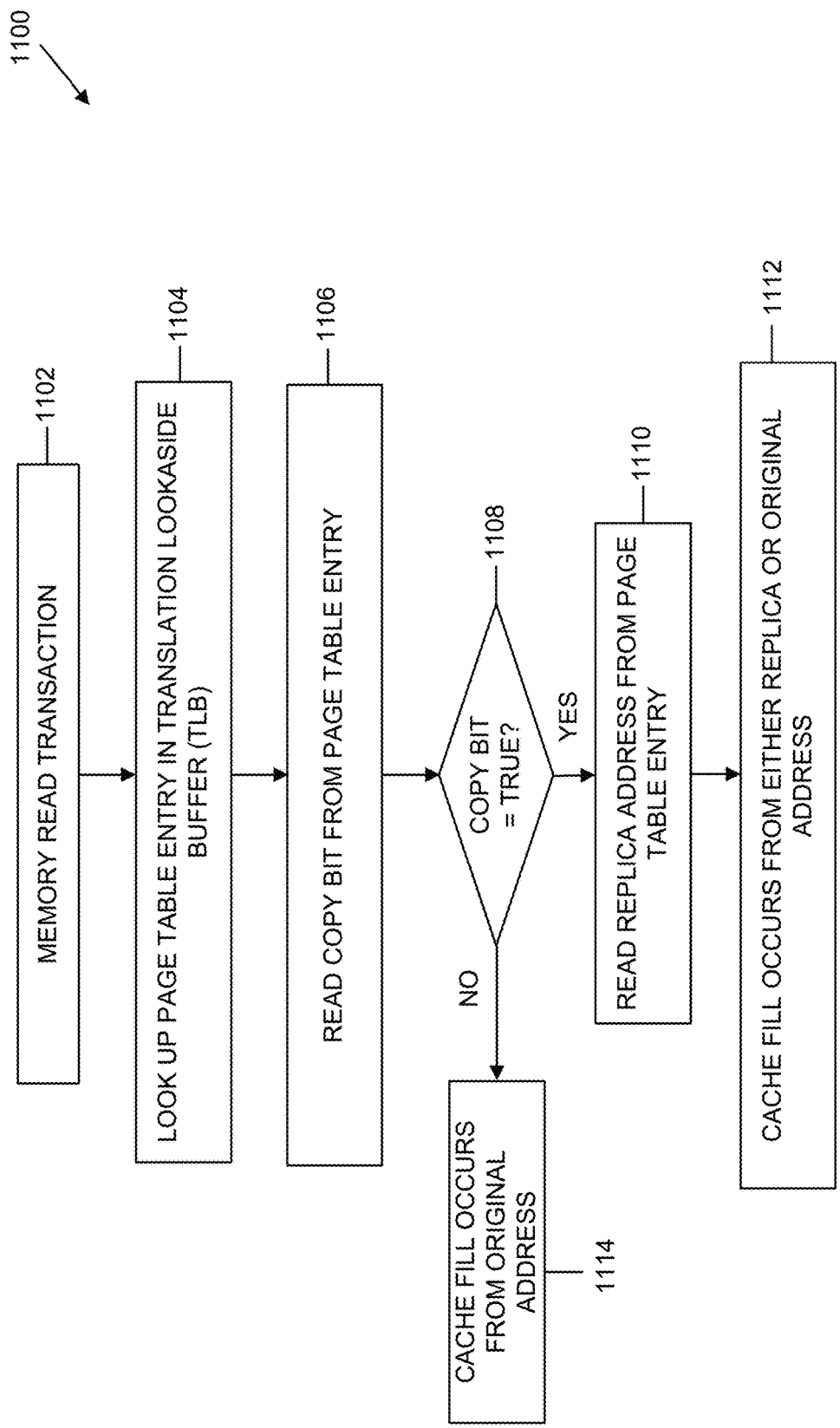
FIG. 11 is a flowchart illustrating an exemplary read transaction implementing the page table entry of FIG. 8.
Figure 12:
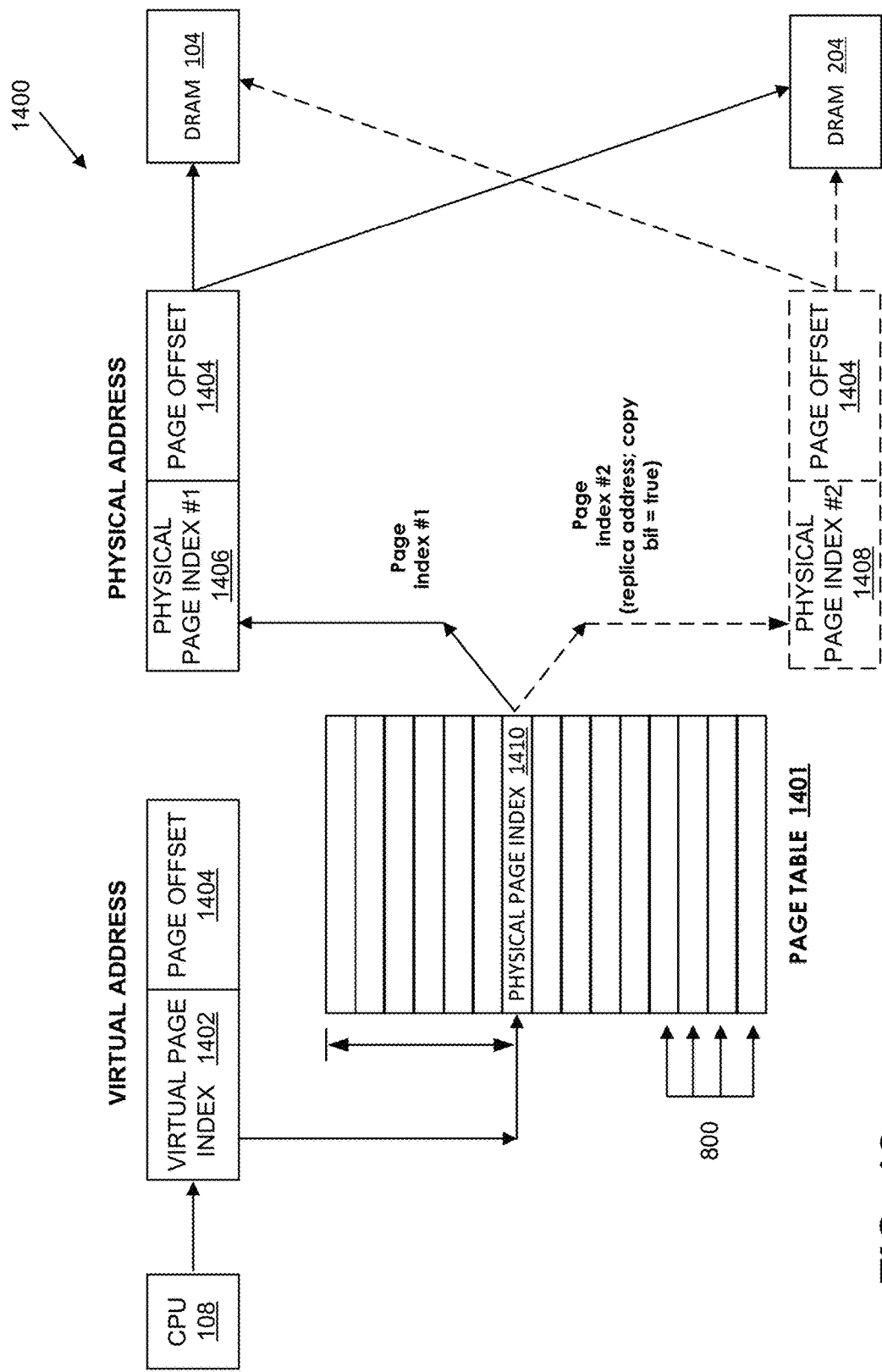
FIG. 12 is a functional block diagram illustrating a page translation diagram for replicating data using the page table entry of FIG. 8.

FIGS. 8-12 illustrate another embodiment of a replication scheme that enables non-blocking, anonymous allocations based on free physical page pairs that do not share the same physical address. This replication scheme may be implemented by the non-blocking NUMA latency modules 203 (FIG. 1) in system 100. To selectively replicate memory data without regard to matching physical addresses, a modified page table entry 800 may be provided, as illustrated in FIG. 8. The modified page table entry 800 comprises the copy attribute field 450, a field 802 for storing a physical page index #1 1406 to a first physical address associated with a first DRAM 104, and a new field 804 for storing a replica address. The replica address comprises a physical page index #2 to a second physical address 1408 associated with a second DRAM 204. In this regard, the page table entry 800 may support the mapping of a single virtual address to physical page pairs having arbitrary (e.g., not required to be the same) physical addresses, one from each die. The page table entry 800 enables translation to both physical addresses. FIG. 12 illustrates how the single virtual address consists of a page index 1402 ($13^{th}$ bit and up), which identifies the particular memory page, and a page offset 1404 (lower 12bits), which identifies the location within the particular memory page, and how the single page index 1402 maps to physical page index#1 1406 and physical page index#2 1408 based upon page table fields 802 and 804, respectively. The page offset 1404 is not modified and is used to access words within each 4KB page.

Figure 9A:
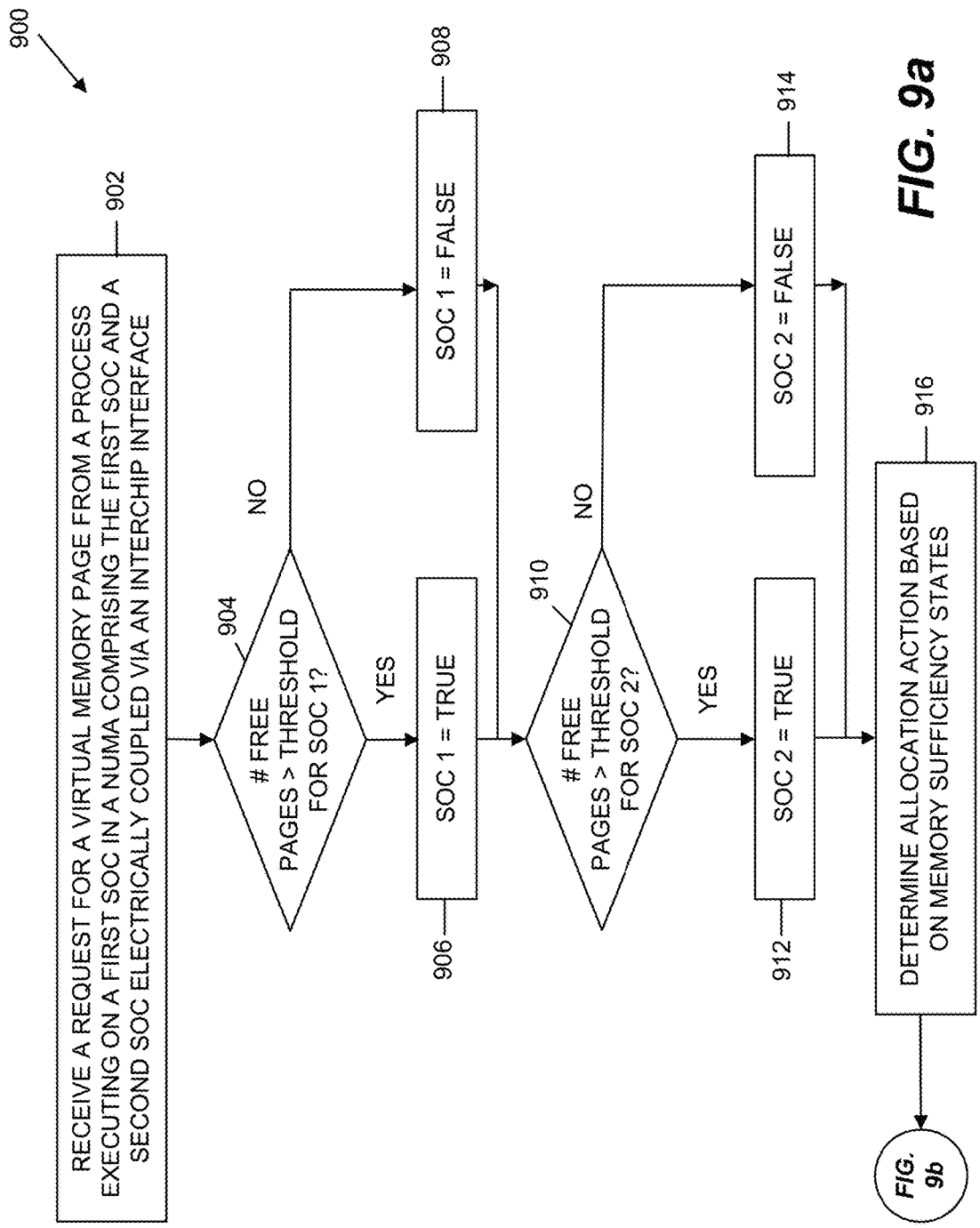
FIGS. 9a and 9b is a flowchart illustrating an embodiment of a method implemented by the non-blocking NUMA latency optimization module(s) in FIGS. 1 and 2.
Figure 9B:
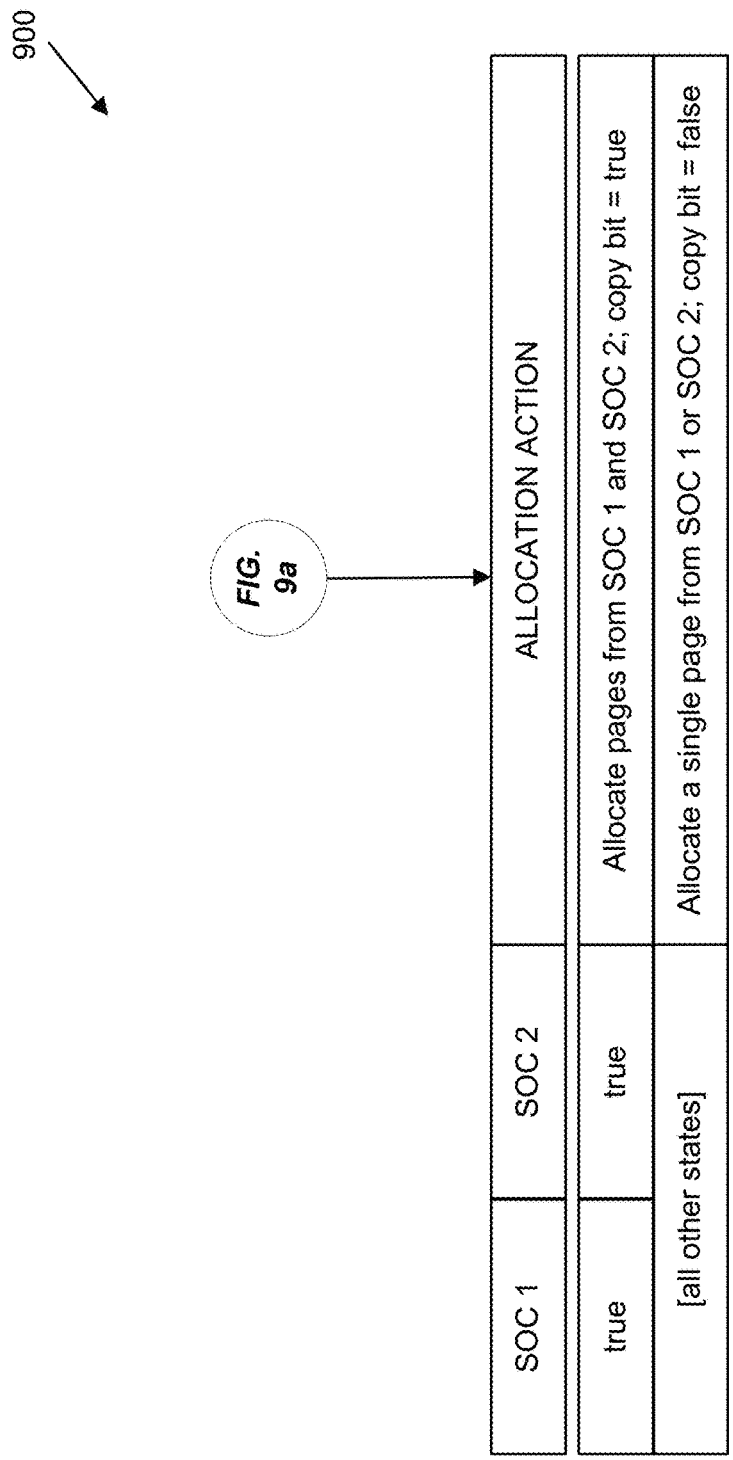

FIG. 9 illustrates a method 900 for allocating memory in a NUMA using arbitrary physical page pairs. At block 902, a request may be received from a process executing on a first SoC 102 for a virtual memory page. The system may implement various thresholds to determine if there is sufficient memory to enable replication. It should be appreciated that replication may occur on a page-by-page basis. In an embodiment, at decision block 904, the system may determine whether a number of available physical pages exceeds a minimum threshold for SoC 102 using DRAM 104. If "yes", at block 906, a memory sufficiency value for SoC 102 may be set to "true". If "no", at block 908, the memory sufficiency value for SoC 102 may be set to "false". At decision block 910, the system may determine whether a number of available physical pages exceeds a minimum threshold for SoC 202 using DRAM 204. If "yes", at block 912, a memory sufficiency value for SoC 202 may be set to "true". If "no", at block 914, the memory sufficiency value for SoC 202 may be set to "false". Based on the memory sufficiency values, at block 916, the system may determine the appropriate allocation action to perform. As illustrated in FIG. 9b, if sufficient memory is available in both SoC 102 and SoC 202 (i.e., both values="true"), the operating system may allocate pages from SoC 102 using DRAM 104 and SoC 202 using DRAM 204 and set the copy bit value to "true" or "1" to enable replication when the copy bit value is enabled in this manner, the replica address may also be added to the page table entry 800. If sufficient memory is available in either SoC 102 or SoC 202 but not both, the operating system may allocate a single page from SoC 102 using DRAM 104 or SoC 202 using DRAM 204 depending on which SoC had sufficient memory (i.e., value="true"). If both SoC 102 and SoC 202 do not have sufficient memory (i.e., both values="false"), the operating system will fail the allocation and trigger an exception. Exception handling for allocation fail is no different than existing methods and invokes an executive program or service that will terminate lower priority infrequently accessed processes in order to free the memory that is allocated to them. It should be appreciated that, in the NUMA where memory may be shared, the single page may be allocated from either SoC 102 using DRAM 104 or SoC 202 using DRAM 204.

FIG. 10 illustrates an embodiment of a method 1000 for performing a memory write transaction involving the modified page table entry 800. It should be appreciated that the method 1000 may be implemented by software and/or hardware. In hardware embodiments, the method may be performed by, for example, a translation look aside buffer (TLB) in a memory management unit (MMU). At block 1000, a memory write transaction is received by the TLB. At block 1004, the TLB performs a look-up to the page table entry 800. At block 1006, the copy bit value 452 is read. If the copy bit value is "true" (decision block 1008), the replica address is read (block 1010) and cache hardware flushes data to both the original physical address (i.e., the source physical address) and the replica physical address. If the copy bit value is "false", the cache hardware flushes data to only the original physical address.

FIG. 11 illustrates an embodiment of a method 1100 for performing a memory read transaction involving the modified page table entry 800. It should be appreciated that the method 1100 may be implemented by software and/or hardware. In hardware embodiments, the method may be performed by, for example, a translation look aside buffer (TLB) in a memory management unit (MMU). At block 1100, a memory read transaction is received by the TLB. At block 1104, the TLB performs a look-up to the page table entry 800. At block 1106, the copy bit value 452 is read. If the copy bit value is "true" (decision block 1108), the replica address is read (block 1110) and a cache fill occurs from either the replica address or the original address (block 1112). If the copy bit value is "false", a cache fill occurs from the original address.

Figure 13:
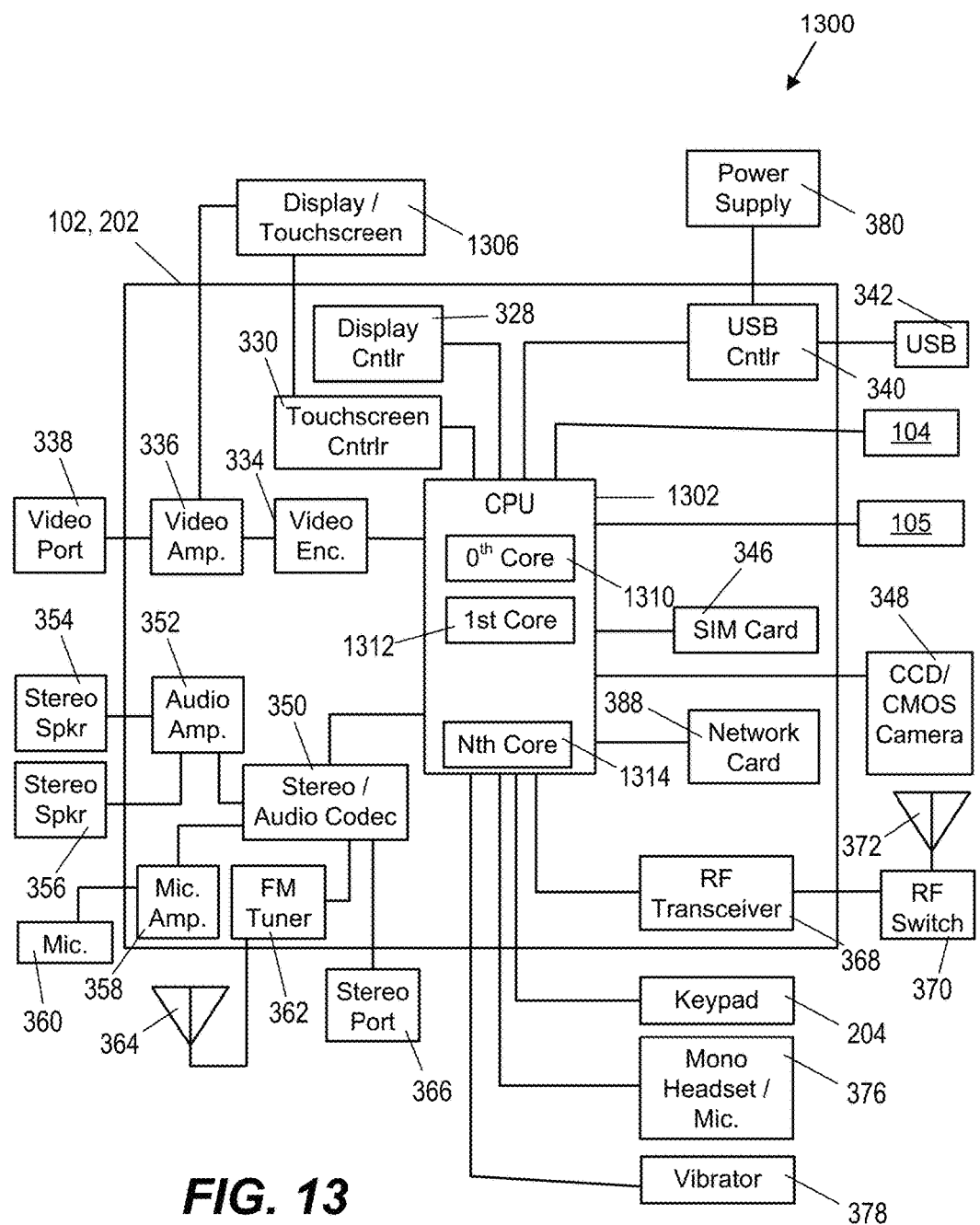
FIG. 13 is a block diagram of another embodiment of a portable communication device that may incorporate a RAM card/socket for expanding system memory.

As mentioned above, the system 100 may be incorporated into any desirable computing system. FIG. 13 illustrates an exemplary portable computing device (PCD) 1300 comprising SoC 102 and SoC 202. In this embodiment, the SoC 102 and SoC 202 may include a multicore CPU 1302. The multicore CPU 1302 may include a zeroth core 1310, a first core 1312, and an Nth core 1314. One of the cores may comprise, for example, a graphics processing unit (GPU) with one or more of the others comprising the CPU.

A display controller 328 and a touch screen controller 330 may be coupled to the CPU 602. In turn, the touch screen display 606 external to the SoC 102 and 202 may be coupled to the display controller 328 and the touch screen controller 330.

FIG. 13 further shows that a video encoder 334, e.g., a phase alternating line (PAL) encoder, a sequential color a memoire (SECAM) encoder, or a national television system(s) committee (NTSC) encoder, is coupled to the multicore CPU 1302. Further, a video amplifier 336 is coupled to the video encoder 334 and the touch screen display 1306. Also, a video port 338 is coupled to the video amplifier 336. As shown in FIG. 13, a universal serial bus (USB) controller 340 is coupled to the multicore CPU 602. Also, a USB port 342 is coupled to the USB controller 340. Memory 104 and 204 and a subscriber identity module (SIM) card 346 may also be coupled to the multicore CPU 1302.

Further, as shown in FIG. 13, a digital camera 348 may be coupled to the multicore CPU 1302. In an exemplary aspect, the digital camera 348 is a charge-coupled device (CCD) camera or a complementary metal-oxide semiconductor (CMOS) camera.

As further illustrated in FIG. 13, a stereo audio coder-decoder (CODEC) 350 may be coupled to the multicore CPU 1302. Moreover, an audio amplifier 352 may be coupled to the stereo audio CODEC 350. In an exemplary aspect, a first stereo speaker 354 and a second stereo speaker 356 are coupled to the audio amplifier 352. FIG. 13 shows that a microphone amplifier 358 may be also coupled to the stereo audio CODEC 350. Additionally, a microphone 360 may be coupled to the microphone amplifier 358. In a particular aspect, a frequency modulation (FM) radio tuner 362 may be coupled to the stereo audio CODEC 350. Also, an FM antenna 364 is coupled to the FM radio tuner 362. Further, stereo headphones 366 may be coupled to the stereo audio CODEC 350.

FIG. 13 further illustrates that a radio frequency (RF) transceiver 368 may be coupled to the multicore CPU 1302. An RF switch 370 may be coupled to the RF transceiver 368 and an RF antenna 372. A keypad 204 may be coupled to the multicore CPU 602. Also, a mono headset with a microphone 376 may be coupled to the multicore CPU 1302. Further, a vibrator device 378 may be coupled to the multicore CPU 1302.

FIG. 13 also shows that a power supply 380 may be coupled to the SoC 102 and SoC 202. In a particular aspect, the power supply 380 is a direct current (DC) power supply that provides power to the various components of the PCD 1300 that require power. Further, in a particular aspect, the power supply is a rechargeable DC battery or a DC power supply that is derived from an alternating current (AC) to DC transformer that is connected to an AC power source.

FIG. 13 further indicates that the PCD 1300 may also include a network card 388 that may be used to access a data network, e.g., a local area network, a personal area network, or any other network. The network card 388 may be a Bluetooth network card, a WiFi network card, a personal area network (PAN) card, a personal area network ultralow-power technology (PeANUT) network card, a television/cable/satellite tuner, or any other network card well known in the art. Further, the network card 388 may be incorporated into a chip, i.e., the network card 388 may be a full solution in a chip, and may not be a separate network card 388.

Referring to FIG. 13 it should be appreciated that the memory 104, the RAM card 105, touch screen display 606, the video port 338, the USB port 342, the camera 348, the first stereo speaker 354, the second stereo speaker 356, the microphone 360, the FM antenna 364, the stereo headphones 366, the RF switch 370, the RF antenna 372, the keypad 374, the mono headset 376, the vibrator 378, and the power supply 380 may be external to the on-chip system 102.

It should be appreciated that one or more of the method steps described herein may be stored in the memory as computer program instructions, such as the modules described above. These instructions may be executed by any suitable processor in combination or in concert with the corresponding module to perform the methods described herein.

Certain steps in the processes or process flows described in this specification naturally precede others for the invention to function as described. However, the invention is not limited to the order of the steps described if such order or sequence does not alter the functionality of the invention. That is, it is recognized that some steps may performed before, after, or parallel (substantially simultaneously with) other steps without departing from the scope and spirit of the invention. In some instances, certain steps may be omitted or not performed without departing from the invention. Further, words such as "thereafter", "then", "next", etc. are not intended to limit the order of the steps. These words are simply used to guide the reader through the description of the exemplary method.

Additionally, one of ordinary skill in programming is able to write computer code or identify appropriate hardware and/or circuits to implement the disclosed invention without difficulty based on the flow charts and associated description in this specification, for example.

Therefore, disclosure of a particular set of program code instructions or detailed hardware devices is not considered necessary for an adequate understanding of how to make and use the invention. The inventive functionality of the claimed computer implemented processes is explained in more detail in the above description and in conjunction with the Figures which may illustrate various process flows.

In one or more exemplary aspects, the functions described may be implemented in hardware, software, firmware, or any combination thereof. If implemented in software, the functions may be stored on or transmitted as one or more instructions or code on a computer-readable medium. Computer-readable media include both computer storage media and communication media including any medium that facilitates transfer of a computer program from one place to another. A storage media may be any available media that may be accessed by a computer. By way of example, and not limitation, such computer-readable media may comprise RAM, ROM, EEPROM, NAND flash, NOR flash, M-RAM, P-RAM, R-RAM, CD-ROM or other optical disk storage, magnetic disk storage or other magnetic storage devices, or any other medium that may be used to carry or store desired program code in the form of instructions or data structures and that may be accessed by a computer.

Also, any connection is properly termed a computer-readable medium. For example, if the software is transmitted from a website, server, or other remote source using a coaxial cable, fiber optic cable, twisted pair, digital subscriber line ("DSL"), or wireless technologies such as infrared, radio, and microwave, then the coaxial cable, fiber optic cable, twisted pair, DSL, or wireless technologies such as infrared, radio, and microwave are included in the definition of medium.

Disk and disc, as used herein, includes compact disc ("CD"), laser disc, optical disc, digital versatile disc ("DVD"), floppy disk and blu-ray disc where disks usually reproduce data magnetically, while discs reproduce data optically with lasers. Combinations of the above should also be included within the scope of computer-readable media.

Alternative embodiments will become apparent to one of ordinary skill in the art to which the invention pertains without departing from its spirit and scope. Therefore, although selected aspects have been illustrated and described in detail, it will be understood that various substitutions and alterations may be made therein without departing from the spirit and scope of the present invention, as defined by the following claims.

What is claimed is:

1. A method for allocating memory in a portable computing device having a non-uniform memory architecture, the method comprising:
receiving from a process executing on a first system on chip a request for a virtual memory page, the first SoC electrically coupled to a second SoC via an interchip interface, the first SoC electrically coupled to a first local volatile memory device via a first high-performance bus and the second SoC electrically coupled to a second local volatile memory device via a second high-performance bus;
determining whether a number of available physical pages on the first local volatile memory device exceeds a minimum threshold for initiating replication of memory data between the first and second local volatile memory devices;
determining whether a number of available physical pages on the second local volatile memory device exceeds a minimum threshold for initiating replication of memory data between the first and second local volatile memory devices; and
if the minimum threshold is exceeded by both the number of available physical pages on the first local volatile memory device and the number of available physical pages on the second local volatile memory device, allocating a first physical address on the first local volatile memory device and a second physical address on the second local volatile memory device to a single virtual page address.

2. The method of claim 1, wherein the allocating the first and second physical addresses to the single virtual page address comprises providing a modified page table entry that enables translation to both the first physical address and the second physical address.

3. The method of claim 2, wherein the modified page table entry comprises a copy attribute set to a true value indicating memory data is to be replicated, a first physical page index to the first physical address, and a second physical page index to the second physical address comprising a replica address.

4. The method of claim 3, further comprising:
receiving a further request for a write transaction to the single virtual page address;
performing a look-up to the page entry table; and
if the copy attribute is set to the true value, reading the replica address and flushing the memory data to both the first physical address and the second physical address.

5. The method of claim 4, further comprising:
if the copy attribute is set to a false value, flushing the memory data to the first physical address.

6. The method of claim 3, further comprising:
receiving a further request for a read transaction to the single virtual page address;
performing a look-up to the page entry table; and
if the copy attribute is set to the true value, reading the replica address and performing a cache fill from a nearer of the first physical address and the second physical address.

7. The method of claim 6, further comprising:
if the copy attribute is set to a false value, performing a cache fill from the first physical address.

8. The method of claim 1, wherein one or more of the first and second local volatile memory devices comprises a dynamic random access memory (DRAM) device.

9. The method of claim 1, wherein the portable computing device comprises one of a mobile phone, a tablet computer, a navigation device, and a portable game console.

10. A system for allocating memory in a portable computing device having a non-uniform memory architecture, the method comprising:
means for receiving from a process executing on a first system on chip (SoC) a request for a virtual memory page, the first SoC electrically coupled to a second SoC via an interchip interface, the first SoC electrically coupled to a first local volatile memory device via a first high-performance bus and the second SoC electrically coupled to a second local volatile memory device via a second high-performance bus;
means for determining whether a number of available physical pages on the first local volatile memory device exceeds a minimum threshold for initiating replication of memory data between the first and second local volatile memory devices;
means for determining whether a number of available physical pages on the second local volatile memory device exceeds a minimum threshold for initiating replication of memory data between the first and second local volatile memory devices; and
means for allocating a first physical address on the first local volatile memory device and a second physical address on the second local volatile memory device to a single virtual page address if the minimum threshold is exceeded by both the number of available physical pages on the first local volatile memory device and the number of available physical pages on the second local volatile memory device.

11. The system of claim 10, wherein the means for allocating the first and second physical addresses to the single virtual page address comprises means for providing a modified page table entry that enables translation to both the first physical address and the second physical address.

12. The system of claim 11, wherein the modified page table entry comprises a copy attribute set to a true value indicating memory data is to be replicated, a first physical page index to the first physical address, and a second physical page index to the second physical address comprising a replica address.

13. The system of claim 12, further comprising:
means for receiving a further request for a write transaction to the single virtual page address;
means for performing a look-up to the page entry table; and
means for reading the replica address and flushing the memory data to both the first physical address and the second physical address if the copy attribute is set to the true value.

14. The system of claim 13, further comprising:
means for flushing the memory data to the first physical address if the copy attribute is set to a false value.

15. The system of claim 12, further comprising:
means for receiving a further request for a read transaction to the single virtual page address;
means for performing a look-up to the page entry table; and
means for reading the replica address and performing a cache fill from a nearer of the first physical address and the second physical address if the copy attribute is set to the true value.

16. The system of claim 15, further comprising:
means for performing a cache fill from the first physical address if the copy attribute is set to a false value.

17. The system of claim 10, wherein one or more of the first and second local volatile memory devices comprises a dynamic random access memory (DRAM) device.

18. The system of claim 10, wherein the portable computing device comprises one of a mobile phone, a tablet computer, a navigation device, and a portable game console.

19. A computer program embodied in a memory and executable by a processor for allocating memory in a non-uniform memory architecture, the computer program comprising logic configured to:
receive from a process executing on a first system on chip (SoC) a request for a virtual memory page, the first SoC electrically coupled to a second SoC via an interchip interface, the first SoC electrically coupled to a first local volatile memory device via a first high-performance bus and the second SoC electrically coupled to a second local volatile memory device via a second high-performance bus;
determining whether a number of available physical pages on the first local volatile memory device exceeds a minimum threshold for initiating replication of memory data between the first and second local volatile memory devices;
determining whether a number of available physical pages on the second local volatile memory device exceeds a minimum threshold for initiating replication of memory data between the first and second local volatile memory devices; and
if the minimum threshold is exceeded by both the number of available physical pages on the first local volatile memory device and the number of available physical pages on the second local volatile memory device, allocating a first physical address on the first local volatile memory device and a second physical address on the second local volatile memory device to a single virtual page address.

20. The computer program of claim 19, wherein the logic configured to allocate the first and second physical addresses to the single virtual page address comprises logic configured to provide a modified page table entry that enables translation to both the first physical address and the second physical address.

21. The computer program of claim 20, wherein the modified page table entry comprises a copy attribute set to a true value indicating memory data is to be replicated, a first physical page index to the first physical address, and a second physical page index to the second physical address comprising a replica address.

22. The computer program of claim 21, further comprising logic configured to:
   receive a further request for a write transaction to the single virtual page address;
   perform a look-up to the page entry table; and
   if the copy attribute is set to the true value, read the replica address and
   flush the memory data to both the first physical address and the second physical address.

23. The computer program of claim 22, further comprising logic configured to:
   flush the memory data to the first physical address if the copy attribute is set to a false value.

24. The computer program of claim 21, further comprising logic configured to:
   receive a further request for a read transaction to the single virtual page address;
   perform a look-up to the page entry table; and
   read the replica address and perform a cache fill from a nearer of the first physical address and the second physical address if the copy attribute is set to the true value.

25. The computer program of claim 24, further comprising logic configured to:
   perform a cache fill from the first physical address if the copy attribute is set to a false value.

26. The computer program of claim 19, wherein one or more of the first and second local volatile memory devices comprises a dynamic random access memory (DRAM) device.

27. The computer program of claim 19, wherein the portable computing device comprises one of a mobile phone, a tablet computer, a navigation device, and a portable game console.

28. A system for allocating memory having a non-uniform memory architecture, the system comprising:
   a first system on chip (SoC) and a second SoC electrically coupled via an interchip interface, the first SoC electrically coupled to a first local volatile memory device via a first high-performance bus and the second SoC electrically coupled to a second local volatile memory device via a second high-performance bus; and
   a system memory manager for managing the first and second local volatile memory devices in a non-uniform memory architecture, the system memory manager comprising logic configured to:
      receive from a process executing on the first SoC a request for a virtual memory page;
      determining whether a number of available physical pages on the first local volatile memory device exceeds a minimum threshold for initiating replication of memory data between the first and second local volatile memory devices;
      determining whether a number of available physical pages on the second local volatile memory device exceeds a minimum threshold for initiating replication of memory data between the first and second local volatile memory devices; and
      if the minimum threshold is exceeded by both the number of available physical pages on the first local volatile memory device and the number of available physical pages on the second local volatile memory device, allocating a first physical address on the first local volatile memory device and a second physical address on the second local volatile memory device to a single virtual page address.

29. The system of claim 28, wherein the system memory manager further comprises logic configured to:
   allocate the first and second physical addresses to the single virtual page address comprises logic configured to provide a modified page table entry that enables translation to both the first physical address and the second physical address.

30. The system of claim 29, wherein the modified page table entry comprises a copy attribute set to a true value indicating memory data is to be replicated, a first physical page index to the first physical address, and a second physical page index to the second physical address comprising a replica address.

31. The system of claim 30, wherein the system memory manager further comprises logic configured to:
   receive a further request for a write transaction to the single virtual page address;
   perform a look-up to the page entry table; and
   if the copy attribute is set to the true value, read the replica address and
   flush the memory data to both the first physical address and the second physical address.

32. The system of claim 31, wherein the system memory manager further comprises logic configured to:
   flush the memory data to the first physical address if the copy attribute is set to a false value.

33. The system of claim 30, wherein the system memory manager further comprises logic configured to:
   receive a further request for a read transaction to the single virtual page address;
   perform a look-up to the page entry table; and
   read the replica address and perform a cache fill from a nearer of the first physical address and the second physical address if the copy attribute is set to the true value.

34. The system of claim 33, wherein the system memory manager further comprises logic configured to:
   perform a cache fill from the first physical address if the copy attribute is set to a false value.

35. The system of claim 28, wherein one or more of the first and second local volatile memory devices comprises a dynamic random access memory (DRAM) device.

36. The system of claim 28, wherein the portable computing device comprises one of a mobile phone, a tablet computer, a navigation device, and a portable game console.

* * * * *